(12) United States Patent
Chun et al.

(10) Patent No.: US 8,270,356 B2
(45) Date of Patent: Sep. 18, 2012

(54) METHOD FOR ENCODING DATA UNIT BY USING A PLURALITY OF CRC ALGORITHMS

(75) Inventors: Sung-Duck Chun, Gyeonggi-Do (KR); Seung-June Yi, Gyeonggi-Do (KR); Sung-Jun Park, Gyeonggi-Do (KR); Young-Dae Lee, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 650 days.

(21) Appl. No.: 12/357,791

(22) Filed: Jan. 22, 2009

(65) Prior Publication Data
US 2009/0196244 A1 Aug. 6, 2009

Related U.S. Application Data

(60) Provisional application No. 61/022,801, filed on Jan. 22, 2008, provisional application No. 61/026,119, filed on Feb. 4, 2008.

(30) Foreign Application Priority Data

Jan. 21, 2009 (KR) .................. 10-2009-0005223

(51) Int. Cl.
*H04W 72/12* (2009.01)

(52) U.S. Cl. .................. 370/329; 370/348; 714/701
(58) Field of Classification Search .................. None
See application file for complete search history.

(56) References Cited

U.S. PATENT DOCUMENTS

| 7,555,010 | B2 * | 6/2009 | Chun et al. ............ 370/469 |
| 2005/0195769 | A1 * | 9/2005 | Kaewell et al. ............ 370/335 |
| 2007/0275712 | A1 * | 11/2007 | Sebire et al. ............ 455/424 |
| 2007/0297451 | A1 * | 12/2007 | Kim et al. ............ 370/469 |

* cited by examiner

*Primary Examiner* — Kwang B Yao
*Assistant Examiner* — Alex Skripnikov
(74) *Attorney, Agent, or Firm* — Birch, Stewart, Kolasch & Birch, LLP

(57) ABSTRACT

A wireless communication system and a terminal providing a wireless communication service and to a method by which a base station and a terminal transmit and receive data in an evolved universal mobile telecommunications system (E-UMTS) evolved from universal mobile telecommunications system (UMTS) or a long term evolution (LTE) system, are disclosed. In transmitting RACH MSG 3 by a terminal to a base station, the terminal transmits the RACH MSG 3 by applying different cyclic redundancy checks (CRCs) according to types of data included in the RACH MSG 3, to thereby reduce overhead of a medium access control protocol data unit (MAC PDU) included in the RACH MSG 3.

4 Claims, 9 Drawing Sheets

FIG 3                                      RELATED ART

FIG 7    RELATED ART
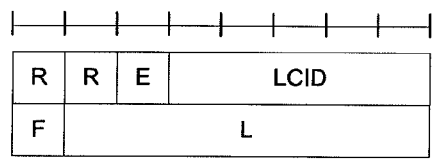 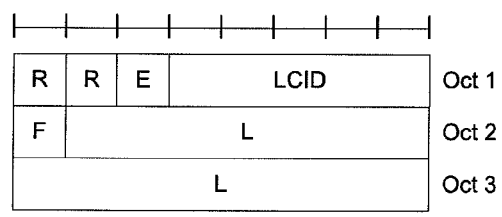
R/R/E/LCID/F/L sub-header with
7-bits L field
R/R/E/LCID/F/L sub-header with
15-bits L field
(a)
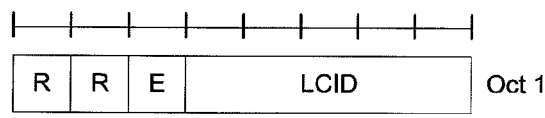
R/R/E/LCID sub-header
(b)

METHOD FOR ENCODING DATA UNIT BY USING A PLURALITY OF CRC ALGORITHMS

TECHNICAL FIELD

The present invention relates to a wireless communication system and a terminal providing a wireless communication service and to a method by which a base station and a terminal transmit and receive data in an evolved universal mobile telecommunications system (E-UMTS) evolved from universal mobile telecommunications system (UMTS) or a long term evolution (LTE) system, and more particularly, to a method whereby, in transmitting RACH MSG 3 by a terminal to a base station, the terminal transmits the RACH MSG 3 by applying different cyclic redundancy checks (CRCs) according to types of data included in the RACH MSG 3, to thereby reduce overhead of a medium access control protocol data unit (MAC PDU) included in the RACH MSG 3.

BACKGROUND ART

FIG. 1 shows a network structure of the E-UMTS, a mobile communication system, applicable to the related art and the present invention. The E-UMTS system has been evolved from the UMTS system, for which the 3GPP is proceeding with the preparation of the basic specifications. The E-UMTS system may be classified as the LTE (Long Term Evolution) system.

The E-UMTS network may be divided into an evolved-UMTS terrestrial radio access network (E-UTRAN) and a core network (CN). The E-UTRAN includes a terminal (referred to as 'UE (User Equipment), hereinafter), a base station (referred to as an eNode B, hereinafter), a serving gateway (S-GW) located at a termination of a network and connected to an external network, and a mobility management entity (MME) superintending mobility of the UE. One or more cells may exist for a single eNode B.

FIGS. 2 and 3 illustrate a radio interface protocol architecture based on a 3GPP radio access network specification between the UE and the base station. The radio interface protocol has horizontal layers comprising a physical layer, a data link layer, and a network layer, and has vertical planes comprising a user plane for transmitting data information and a control plane for transmitting control signals (signaling). The protocol layers can be divided into the first layer (L1), the second layer (L2), and the third layer (L3) based on three lower layers of an open system interconnection (OSI) standard model widely known in communication systems.

The radio protocol control plane in FIG. 2 and each layer of the radio protocol user plane in FIG. 3 will now be described.

The physical layer, namely, the first layer (L1), provides an information transfer service to an upper layer by using a physical channel. The physical layer is connected to an upper layer called a medium access control (MAC) layer via a transport channel, and data is transferred between the MAC layer and the physical layer via the transport channel. Meanwhile, between different physical layers, namely, between a physical layer of a transmitting side and that of a receiving side, data is transferred via a physical channel.

The MAC layer of the second layer provides a service to a radio link control (RLC) layer, its upper layer, via a logical channel. An RLC layer of the second layer may support reliable data transmissions. A PDCP layer of the second layer performs a header compression function to reduce the size of a header of an IP packet including sizable unnecessary control information, to thereby effectively transmit an IP packet such as IPv4 or IPv6 in a radio interface with a relatively small bandwidth.

A radio resource control (RRC) layer located at the lowest portion of the third layer is defined only in the control plane and handles the controlling of logical channels, transport channels and physical channels in relation to configuration, reconfiguration and release of radio bearers (RBs). The radio bearer refers to a service provided by the second layer (L2) for data transmission between the UE and the UTRAN.

A random access channel (RACH) will now be described. The RACH is used to transmit data with a relatively short length to uplink, and in particular, the RACH is used when a UE, which has not been allocated dedicated radio resources, has a signaling message or user data to be transmitted to uplink. Or, the RACH may be also used for a base station to instruct a UE to perform a RACH procedure.

A random access channel (RACH) procedure provided by the LTE system will now be described. The RACH procedure provided by the LTE system is divided into a contention-based RACH procedure and a non-contention-based RACH procedure. The contention-based RACH procedure and the non-contention-based RACH procedure are determined based on whether or not a random access preamble used in a RACH procedure has been directly selected by a UE or by a base station.

In the non-contention-based RACH procedure, the UE uses a random access preamble the base station has directly allocated to the UE. Thus, when the base station allocates the particular random access preamble only to the UE, the random access preamble is used by only the UE while other UEs do not use it. Thus, a one-to-one relationship is established between the random access preamble and the UE using the random access preamble, so there is no collision. This is effective because the base station can recognize the UE that has transmitted the random access preamble upon receiving the random access preamble.

Meanwhile, in the contention-based RACH procedure, the base station selectively transmits one of random access preambles, so there is a possibility that a plurality of UEs may use the same random access preamble. Thus, when the base station receives a certain particular random access preamble, it cannot recognize which UE has transmitted the random access preamble.

In general, the UE may perform the RACH procedure in the following cases: 1) when the UE performs initial accessing because it is not RRC-connected with the base station, 2) when the UE is first connected to a target cell during a handover process, 3) when the RACH procedure is requested by an instruction of the base station, 4) when data to uplink is generated in a state that time synchronization of uplink is not matched or in a state that designated radio resources used for requesting radio resources have not been allocated, and 5) when a recovery process is performed in case of a radio link failure or a handover failure.

FIG. 4 shows operations of the UE and the base station in the contention-based RACH procedure.

First, in the contention-based random access, the UE randomly selects one random access preamble from a set of random access preambles instructed by system information or a handover command, selects PRACH resource that can transmit the random access preamble, and transmits the same (first step). The preamble at this time is called an RACH MSG 1.

After transmitting the random access preamble, the UE attempts receiving of a response to its random access preamble within a random access response reception window instructed by the system information or the handover command (second step). In more detail, random access response information is transmitted in the form of MAC PDU, and the MAC PDU may be transferred via a physical downlink shared channel (PDSCH). In addition, in order for the UE to properly receive information transmitted via the PDSCH, a physical downlink control channel (PDCCH) is also transferred. Namely, the PDCCH may include information about the UE which is to receive the PDSCH, frequency and time information of radio resources of the PDSCH, a transmission format of the PDSCH, and the like. Here, when the UE successfully receives the PDCCH which has been transmitted thereto, it properly receives the random access response transmitted via the PDSCH according to the information of the PDSCH. The random access response includes a random access preamble identifier (ID), a UL grant (uplink radio resources), a temporary C-RNTI (temporary cell identifier), and a time alignment command (time synchronization correction value). The reason why the random access preamble ID is required is because one random access response may include random access response information for one or more UEs, so the random access preamble ID informs about for which UE the UL grant, the temporary C-RNTI and the time alignment command information are valid. The random access preamble ID is identical to the random access preamble that has been selected by the UE itself.

Here, when the UE receives the random access response valid for the UE itself, the UE processes information included in the random access response. Namely, the UE applies the time alignment command and stores the temporary C-RNTI. In addition, the UE transmits data stored in its buffer or newly generated data to the base station (third step). In this case, data (referred to as 'MSG 3', hereinafter) included in the UL grant should necessarily include an identifier of the UE. The reason is because, in the contention-based RACH procedure, the base station can hardly determine which UEs perform the RACH procedure, and it should identify UEs to prevent occurrence of collision. Here, there are two methods for including the ID of the UE. The first method is that when the UE already has a valid cell ID which has been allocated in a corresponding cell before the RACH procedure, the UE transmits its cell ID via the UL grant. If, however, the UE has not been allocated a valid cell ID before the RACH procedure, the UE includes its unique ID (e.g., an S-TMSI or a random ID) and transmits the same. In general, the unique ID is longer than the cell ID. In the third step, when the UE transmits data via the UL grant, the UE starts a contention resolution timer.

After the UE transmits the data including its ID via the UL grant included in the random access response, the UE waits for an instruction of the base station to resolve contention. Namely, the UE attempts receiving of the PDCCH to receive a particular message (a fourth step). Here, there are two methods for receiving the PDCCH. As mentioned above, if the identifier of the UE transmitted via the UL grant is a cell ID of the UE, the UE attempts receiving of the PDCCH by using its cell ID, and if the identifier is its unique ID, the UE attempts receiving of the PDCCH by using the temporary C-RNTI included in the random access response. Thereafter, in the former case, if the UE receives the PDCCH (referred to as 'MSG 4', hereinafter) via its cell ID before the contention resolution timer expires, the UE determines that the RACH procedure has been normally performed, and terminates the RACH procedure. In the latter case, if the PDCCH is received via the temporary cell ID before the contention resolution timer expires, the UE checks data (referred to as 'MSG 4', hereinafter) transferred by the PDSCH indicated by the PDCCH. If content of the data includes its unique ID, the UE determines that the RACH procedure has been normally performed and terminates the RACH procedure. Here, the message or the MAC PDU received in the fourth step is usually called RACH MSG 4.

A method for receiving downlink data by the UE in the LTE system will now be described. FIG. 5 illustrates allocation or radio resources according to the related art.

In the downlink direction, physical channels are divided into the physical downlink control channel (PDCCH) and the physical downlink shared channel (PDSCH). The PDCCH is not directly related to transmission of user data and transmits control information required for operating a physical channel. Briefly, the PDCCH may be used to control other physical channels. In particular, the PDCCH is used to transmit information required for receiving the PDSCH. Information such as for which UE data is designated to be transmitted by using a particular frequency band at a particular point, which size of data is transmitted, and the like, is transmitted via the PDCCH. Thus, each UE receives the PDCCH at a particular TTI and checks whether or not data to be received by the UE is transmitted via the PDCCH. If it is informed that data to be received by the UE is transmitted, the UE additionally receives the PDSCH by using information such as frequency indicated by the PDCCH. Information about to which UE (one or a plurality of UEs) data of the PDSCH is transmitted or how the UEs receive the PDSCH data and decode it, and the like, may be included in a physical PDCCH and transmitted.

For example, it is assumed that, in a particular sub-frame, radio resource information (e.g., a frequency position) called 'A' and transmission format information (e.g., transport block size, modulation and coding information, etc.) called 'B' are CRC-masked to an RNTI (Radio Network Temporary Identity) called 'C', and transmitted via the PDCCH. One or two or more UEs located in a corresponding cell monitor the PDCCH by using their RNTI information, and on the above assumption, when the UE having the RNTI called 'C' decodes the PDCCH, a CRC error does not occur. Thus, the UE decodes the PDSCH to receive the data by using the transmission format information called 'B' and the radio resource information called 'A'. Meanwhile, on the above assumption, if the UE does not have the RNTI called 'C', when the PDCCH is decoded, a CRC error occurs. Thus, the UE does not receive the PDSCH.

In the above procedure, the RNTI (Radio Network Temporary Identifier) is transmitted to inform to which UEs radio resources have been allocated. The RNTI includes a dedicated RNTI and a common RNTI. The dedicated RNTI is allocated to a single UE and used to transmit/receive data corresponding to the UE. The dedicated RNTI is allocated only to a UE whose information has been registered in the base station. Meanwhile, the common RNTI is used when UEs, which have not been allocated the dedicated RNTI because their information was not registered to the base station, transmit or receive data to or from the base station, or the common RNTI is used to transmit information commonly applied for a plurality of UEs.

First, the structure of the MAC PDU (Medium Access Control Protocol Data Unit) used for a MAC entity will now be described. FIG. 6 shows a format of the MAC PDU used for the MAC entity. In FIG. 6, an LCID informs to which logical channel a corresponding MAC SDU corresponds, and 'L' field informs about the size of the corresponding MAC SDU. An 'E' field informs whether or not there are additional headers. In the process, if the size of the corresponding MAC SDU or a MAC control element is larger than 127, the 'L' field of 15 bits is used. For a MAC sub-header with respect to the MAC SDU included in a MAC PDU or for a size-fixed MAC control element, a MAC sub-header in the form as shown in FIG. 7(b) is used. For other cases, a MAC sub-header in the form as shown in FIG. 7(a) is used.

Each field as used in FIG. 6 will now be described in detail as follows.

LCID: It informs about a logical channel to which a corresponding MAC SDU belongs, or which information a corresponding MAC CE (MAC Control Element) includes.

E: It informs about whether or not there is another MAC sub-header after the current MAC sub-header.

F: It informs about the length of a subsequent 'L' field.

R: It is a reserved bit which is not in use.

Here, information about the values used for the LCID may be shown as the below tables.

TABLE 1

LCKD values for DL-SCH

| Index | LCID values |
|---|---|
| 00001-xxxxx | Identity of the logical channel |
| xxxxx-11011 | Reserved |
| 11100 | UE Contention Resolution Identity |
| 11101 | Timing Advance |
| 11110 | DRX Command |
| 11111 | Padding |

TABLE 2

LCID values for UL-SCH

| Index | LCID values |
|---|---|
| 00000-yyyyy | Identity of the logical channel |
| yyyyy-11011 | Reserved |
| 11100 | Power Headroom Report |
| 11101 | Short Buffer Status Report |
| 11110 | Long Buffer Status Report |
| 11111 | Padding |

In general, when a call starts, a UE, which has not made an RRC connection, should make the RRC connection with a base station. At this time, the UE performs the RACH procedure. For a UE, which has made the RRC connection but there is no uplink radio resources allocated to the UE, if data is generated, the UE should perform the RACH procedure. In the two cases, the UE configures a MAC PDU with a size corresponding to information included in the random access response received in the second step of the RACH procedure based on the information, and transmits the MAC PDU to the base station by using radio resources indicated by the information. In this case, a total amount of data, namely, the size of the MAC PDU, the UE can transmit in the uplink direction is substantially 56 bits. In addition, the RRC message initially transmitted by the UE, which is not in the RRC-connected state, is an RRC connection request message with a size of substantially 56 bits The RRC message is delivered in the form of MAC SDU to the MAC layer via the RLC layer. In order to configure the MAC PDU, a MAC header and a MAC SDU are required, and in this case, a minimum size of the MAC header is, if a single MAC sub-header is considered, 8 bits. Accordingly, when the MAC PDU including only the RRC connection request message is configured, it has the minimum 64 bits, which is larger than the message that can be transmitted in the third step of the RACH procedure.

The message transmitted by the RRC-connected UE to request allocation of radio resources from the base station is a buffer status report (BSR). There are two types of BSRs, of which a larger one has 32 bits including the MAC sub-header. Also, the UE should send its information to the base station, and it is a MAC C-RNTI CE (Control Element) which has 24 bits including the MAC sub-header. Thus, the size of the configured MAC PDU is 56 bits, and the MAC PDU can be transmitted in the third step of the RACH procedure.

In the third step of the RACH procedure, in order to transmit the RRC connection request message, 1) the size of the MAC PDU that can be transmitted in the third step of the RACH procedure should be increased, or 2) the size of the RRC connection request message should be reduced. In this case, however, when the size of the MAC PDU that can be transmitted in the third step of the RACH procedure is increased by 64 bits, the UE in the RRC-connected state should unnecessarily include 8 its in the MAC PDU. Also, when the size of the RRC connection request message is reduced, the UE should perform another RACH procedure to send remaining information, lengthening time for performing the RRC connection. In the process, when the RRC connection request message is included in the MAC PDU, the MAC PDU could be configured according to the limitation of 56 bits without the MAC sub-header, but then, when a receiving side receives the MAC PDU, it cannot know whether or not the MAC PDU includes the RRC connection request message or the BSR.

DISCLOSURE OF THE INVENTION

Therefore, an object of the present invention is to provide a method for enhancing efficiency of data transmission when a base station and a UE transmit and receive data.

To achieve these and other advantages and in accordance with the purpose of the present invention, as embodied and broadly described herein, there is provided a method for communicating data in a wireless communication system, including: receiving at least one data from an upper layer; selecting one of configured error-checking functions based on the at least one received data; processing the at feast one received data by using the selected error-checking function; and transmitting the processed data.

To achieve these and other advantages and in accordance with the purpose of the present invention, as embodied and broadly described herein, there is also provided a method of communicating data in a wireless communication system, the method comprising: receiving at least one data; processing the at least one received data by using all the error-checking functions within configured error-checking functions; determining which error-checking function has been successfully performed on the at least one received data; and decoding the at least one received data by using a configuration in relation to the determined error-checking function.

To achieve these and other advantages and in accordance with the purpose of the present invention, as embodied and broadly described herein, there is also provided a method of communicating data in a wireless communication system, the method comprising: receiving at least one data from an upper layer; selecting a preamble based on the at least one received data; transmitting the selected preamble; receiving a response message in response to the selected preamble, wherein the response message includes an allocated radio resource for transmitting next scheduled data; and transmitting the next scheduled data by using a configuration related to the selected preamble.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7A and 7B illustrate a format of MAC sub-header used for the MAC entity

MODES FOR CARRYING OUT THE PREFERRED EMBODIMENTS

Figure 1:
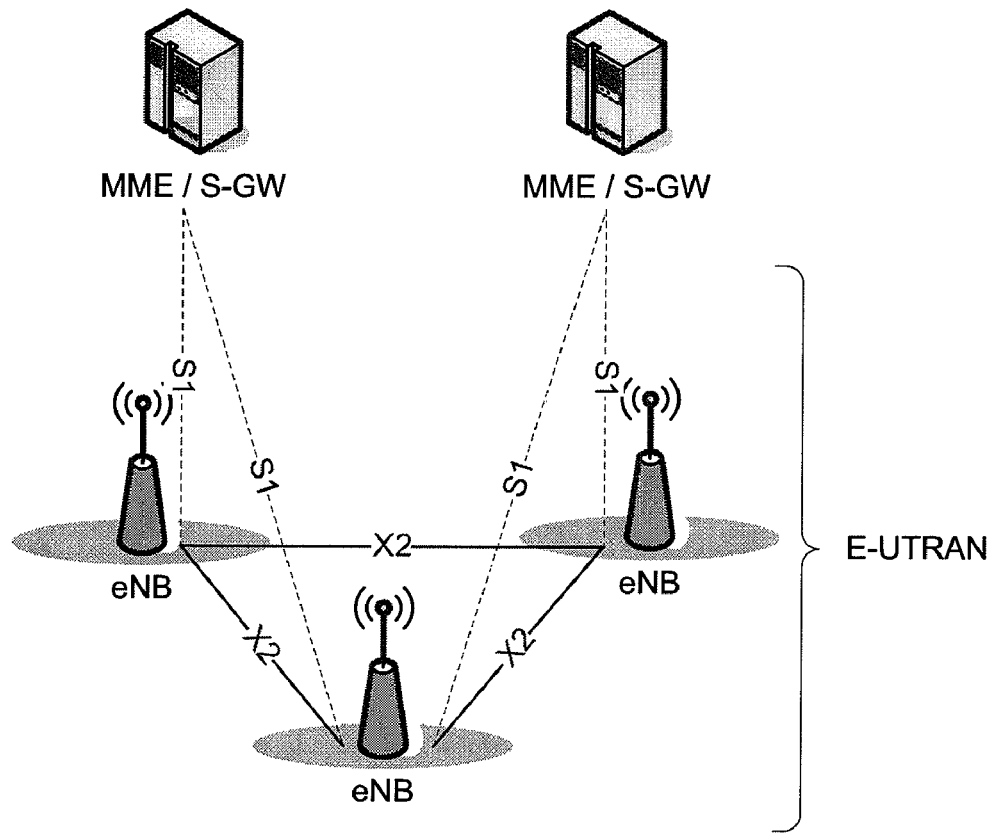
FIG. 1 shows a network structure of an E-UMTS, a mobile communication system, applicable to the related art and the present invention.
Figure 2:
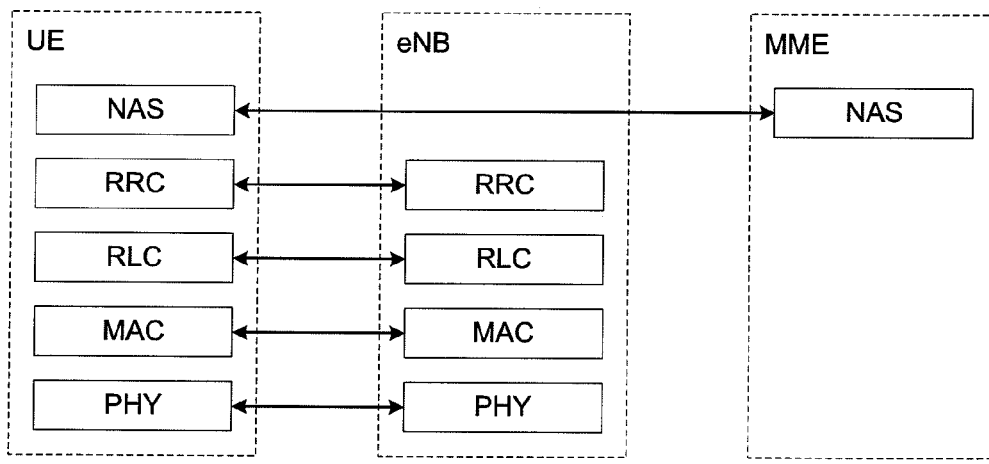
FIG. 2 shows an exemplary structure of a control plane of a radio interface protocol between a UE and a UTRAN according to the related art.
Figure 3:
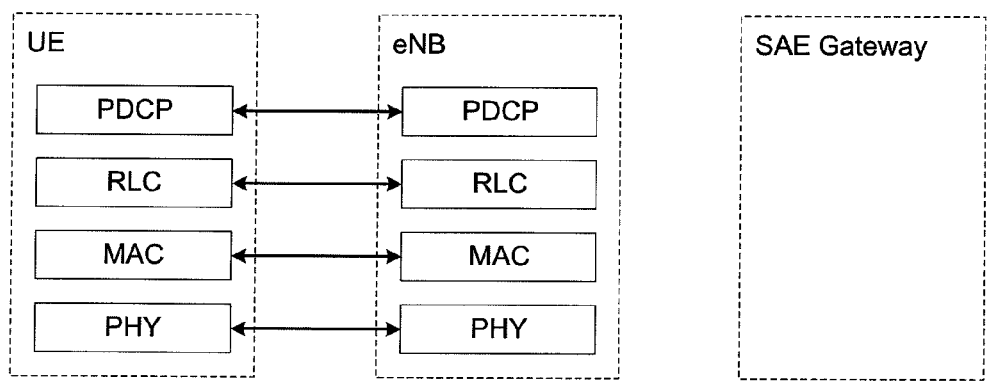
FIG. 3 shows an exemplary structure of a user plane of the radio interface protocol between the UE and the UTRAN according to the related art.
Figure 4:
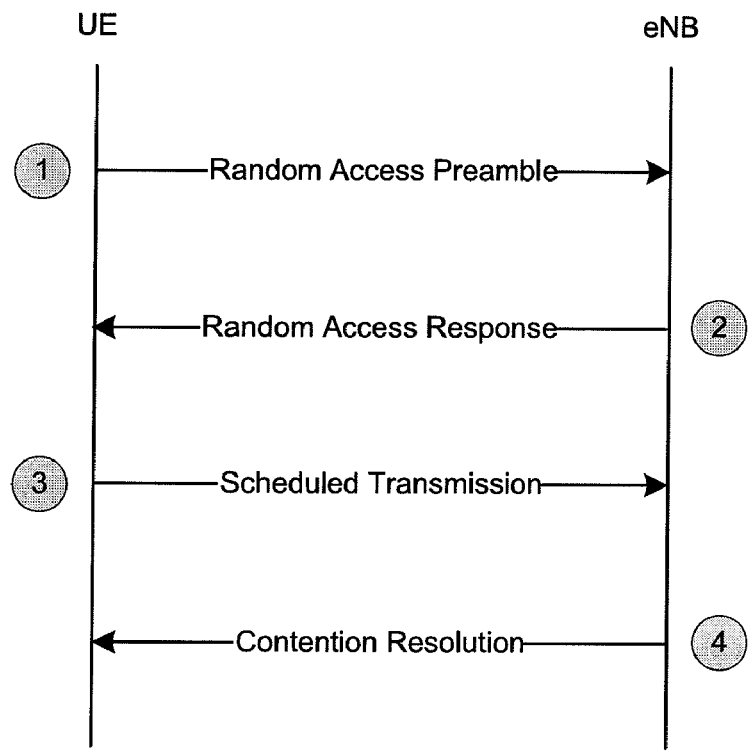
FIG. 4 illustrates a contention-based RACH procedure.
Figure 5:
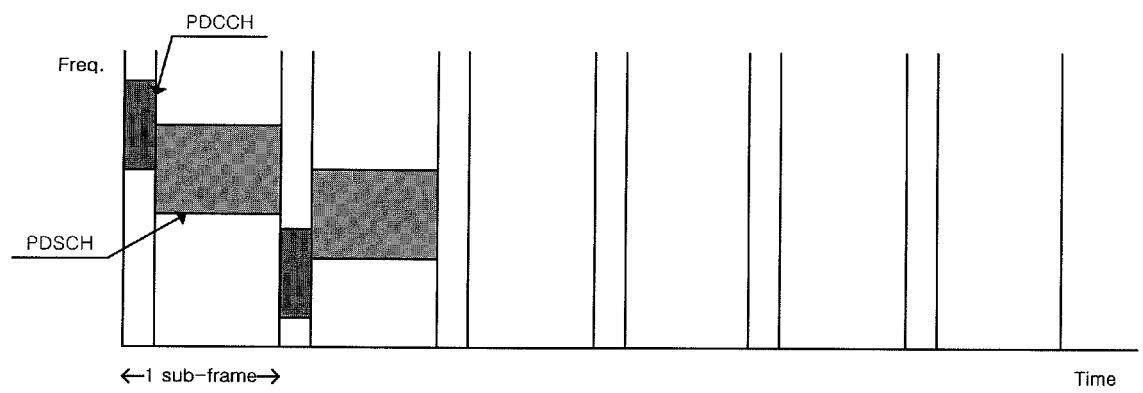
FIG. 5 illustrates allocation of radio resources according to the related art.
Figure 6:
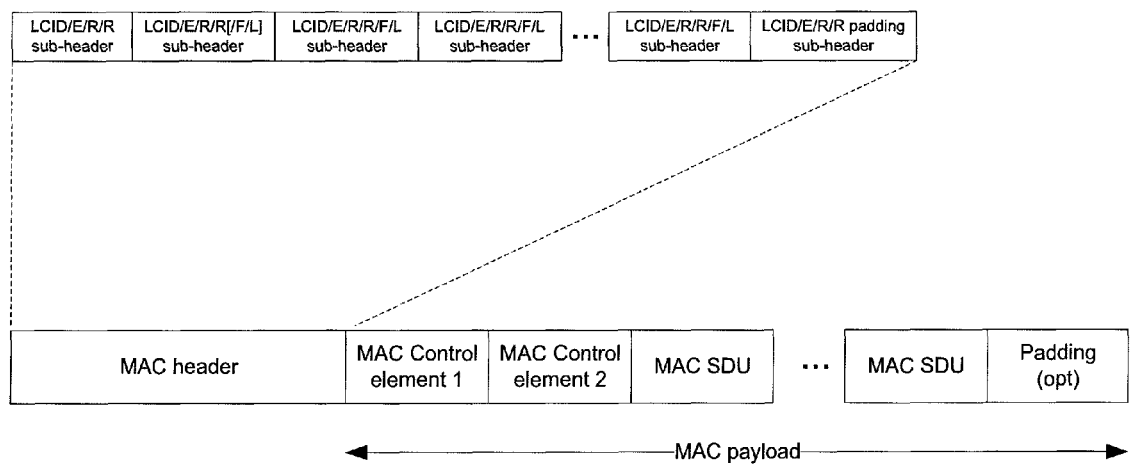
FIG. 6 illustrates a format of a protocol data unit (PDU) used for a medium access control (MAC) entity.

One aspect of this disclosure relates to the recognition by the present inventors about the problems of the related art as described above, and further explained hereafter. Based upon this recognition, the features of this disclosure have been developed.

Although this disclosure is shown to be implemented in a mobile communication system, such as a UMTS developed under 3GPP specifications, this disclosure may also be applied to other communication systems operating in conformity with different standards and specifications.

Hereinafter, description of structures and operations of the preferred embodiments according to the present invention will be given with reference to the accompanying drawings.

The present invention provides a method whereby a transmitting side informs a receiving side about content or a type of a data block to be transmitted by the transmitting side without using additional radio resources, to thereby effectively process the data block (or data unit). In more detail, the present invention provides a method whereby the receiving side can recognize the content or the type of the data block included in a MAC PDU without using information included in the MAC PDU.

In the present invention, the transmitting side transmits data by applying different processing methods according to the characteristics of the data to be transmitted. Also, the receiving side applies different processing methods to a received data block, recognizes the characteristics of the received data block, and processes the received data block. In the process, the characteristics of the data to be transmitted refer to a type of data included in the data block, from which logical channel the data block has been received, or whether or not the data block has been received from an upper layer. The data block to be transmitted in the process refers to a medium access control protocol data unit (MAC PDU), a transport block (TB), or a PDU. In the process, the type of data included in the data block refers to whether or not the data is a control message or user data, whether or not the data is an RRC message, whether or not the data is a CCCH message, or whether or not the data is a MAC control element (CE).

Also, in the process, from which logical channel the data has been received refers to whether or not the data is data that has been received from a common control channel, from a dedicated control channel, from a dedicated traffic channel, from a common traffic control, from a broadcast control channel, from MBMS control channel, or from MBMS traffic channel.

Also, in the process, data received from an upper layer refers to whether or not data included in the data block, which is to be configured and transmitted by the transmitting side, is data that has been received from an upper layer or whether or not it is data the UE has directly configured and made. Also, in the process, the data the UE has directly configured and made refers to a control message the UE has directly configured and included. Also, in the process, the control message the UE has directly configured and included refers to a MAC control element.

In the process, the different processing methods refer to application of different CRC algorithms. Namely, results obtained by using different CRC algorithms are applied to a data block, which is then transmitted. Or, the different processing methods refer to application of different parity algorithms. Namely, results obtained by using different parity algorithms are applied to a data block, which is then transmitted. The different processing methods refer to application of different security algorithms. That is, results obtained by using different security algorithms are applied to a data block, which is then transmitted. The different processing methods refer to application of different robust algorithms. That is, results obtained by using different robust algorithms are applied to a data block, which is then transmitted. The robust algorithm refers to a method for determining whether or not there is an error in a data block.

The procedures will now be described in more detail. First, it is assumed that processing methods 'A' and 'B' are set in the transmitting side, and a processing method 'A' is used to process data with the characteristics 'C' and the processing method 'B' is used to process data with characteristics 'D'. In this case, each time a data block is transmitted, the transmitting side recognizes the characteristics of data included in the data block, determines a processing method to be used, and applies the determined processing method to the data block. For example, if the data block to be transmitted includes data with characteristics 'C', the transmitting side transmits the data block by applying the processing method 'A'. For example, if the data block to be transmitted includes data with characteristics 'B', the transmitting side transmits the data block by applying the processing method 'D'.

The different processing methods in the procedures refer to using of different parameters according to the characteristics of data, using of different parameters for using CRC values according to characteristics of data, or using of different CRC maskings according to characteristics of data.

For example, different parameters may be used to calculate a CRC according to the characteristics of data, different RNTIs (Radio Temporary Network Identity) may be used, or different RNTIs may be used for a CRC algorithm, or the like.

In the procedure, applying different processing methods to a data block received by the receiving side and processing the data block according to the result refers to that the receiving side applies every set processing method to the received data block, checks a successfully finished processing method, checks the characteristics of the data block related to the processing method, and processes the received data block accordingly.

In more detail, it is assumed that processing methods 'A' and 'B' are set in the receiving side, and the processing method 'A' is used to process data with characteristics 'C' and the processing method 'B' is used to process data with characteristics 'D'. In this case, each time a data block is received, the receiving side applies the processing methods 'A' and 'B'. At this time, the receiving side checks a successfully finished processing method. For example, if the processing method 'A' is successfully finished for the received data block, the UE assumes that the data block includes data with the characteristics 'C' and performs additional processing. For example, if the processing method 'B' is successfully finished for the received data block, the UE assumes that the data block includes data with the characteristics 'D' and performs additional processing.

The configuration and operation of the exemplary embodiments of the present invention will now be described with reference to the accompanying drawings.

Figure 8:
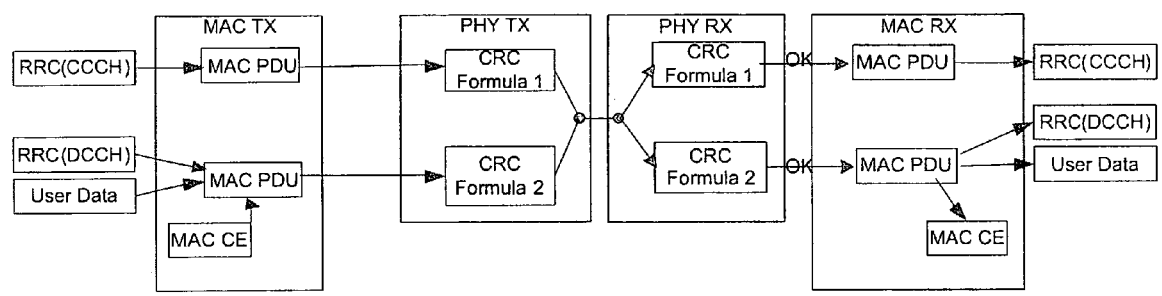
FIG. 8 illustrates an operation of encoding or decoding a data unit by using a plurality of CRC formulas according to an embodiment of the present invention.

FIG. 8 illustrates an operation of encoding or decoding a data unit by using a plurality of CRC formulas according to an embodiment of the present invention. In this illustration, it is assumed that there are two types of data and two types of CRC formulas (algorithms). In the illustration, it is assumed that a CRC formula 1 is used for data transmission via a common control channel (CCCH), and a CRC formula 2 is used for data transmission via other channels than the CCCH. In this illustration, when a MAC PDU is configured and transmitted, the transmitting side checks whether or not data included in the MAC PDU is the CCCH, and if CCCH data is included, the transmitting side applies the CRC formula 1 to the MAC PDU and transmits the same. In the illustration, when a MAC PDU is configured and transmitted, the transmitting side checks whether or not data included in the MAC PDU is the CCCH, and if CCCH data is not included, the transmitting side applies the CRC formula 2 to the MAC PDU and transmits the same. In the illustration, the receiving side applies both the CRC formulas 1 and 2 to a received data block, and checks a side where the CRC success occurs. If CRC checking has been successfully finished at the CRC formula 1, the receiving side concludes that the data block, namely, the MAC PDU, includes data of CCCH, and processes the MAC PDU. If the CRC checking has been successfully finished at the CRC formula 2, the receiving side concludes that the data block, namely, the MAC PDU, does not include data of CCCH, and processes the MAC PDU.

In the procedure, the CRC formula refers to an algorithm or a hash function to generate a CRC value. In the illustration of FIG. 8, it may be implemented such that the formulas 1 and 2 use the same CRC algorithm but use different input values, for example, different RNTIs. In the procedure, when a type of characteristics of data is checked, the receiving side may reassemble the MAC PDU according to a corresponding MAC PDU structure. For example, if CCCH is included in the MAC PDU, the receiving side reassembles the MAC PDU without including a MAC subheader. If other data than CCCH is included in the MAC PDU, the receiving side may reassemble the MAC PDU such that it includes the MAC subheader. Accordingly, the transmitting side and the receiving side may use different MAC PDU structures according to data characteristics.

Figure 9:
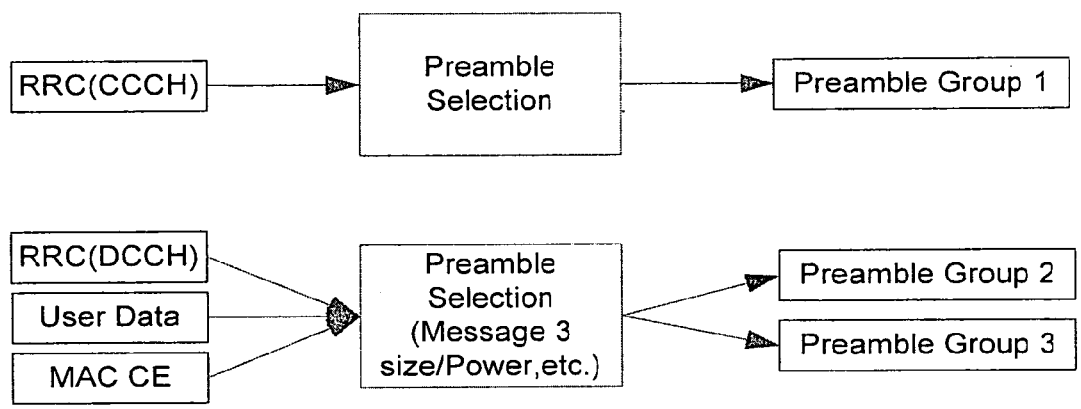
FIG. 9 illustrates an operation method by setting a particular message or data of a particular channel by random access preamble groups.

In order to solve the above-described problem, the present invention proposes discriminating RACH access preambles. Namely, when transmission of a CCCH message or a particular message is required, the UE selects a particular preamble group and transmits it. When the base station receives a preamble belonging to the particular preamble group, it allocates more bits to the preamble. FIG. 9 illustrates an operation method by setting a particular message or data of a particular channel by random access preamble groups. As shown in FIG. 9, the UE selects a preamble group according to whether or not a message to be transmitted by the UE is a CCCH message, and transmits one preamble. Namely, in the present invention, in order to transmit a particular message or data of a particular channel, a random access preamble group is set, and if data of the particular channel or a particular message needs to be transmitted, the UE selects the random access preamble group. In this case, the base station may inform the UE about the particular channel, the particular message, and the particular preamble group.

As so far described, when the UE transmits the RACH message 3 (MSG 3) to the base station, it applies different CRC algorithms according to types of data included in the RACH MSG 3 to transmit the RACH MSG 3, whereby overhead of the MAC PDU included in the RACH MSG 3 can be reduced to improve the efficiency of data transmission.

The present disclosure may provide a method of communicating data in a wireless communication system, the method comprising: receiving at least one data from an upper layer; selecting one of configured error-checking functions based on the at least one received data; processing the at least one received data by using the selected error-checking function; and transmitting the processed data, wherein the upper layer is a MAC (Medium Access Control) layer or a RLC (Radio Link Control) layer, the at least one data is a MAC PDU (Medium Access Control Protocol Data Unit) or an RLC PDU (Radio Link Control Protocol Data Unit), the error-checking function is a CRC (Cyclic Redundancy Check) function, the error-checking function is selected based on a data format of the at least one received data, the error-checking function is selected based on a receiving channel of the at least one received data, and the at least one received data is processed by attaching the selected error-checking function to the at least one received data.

It can be also said that the present disclosure may provide a method of communicating data in a wireless communication system, the method comprising: receiving at least one data; processing the at least one received data by using all the error-checking functions within configured error-checking functions; determining which error-checking function has been successfully performed on the at least one received data; and decoding the at least one received data by using a configuration in relation to the determined error-checking function, wherein the error-checking function is a CRC (Cyclic Redundancy Check) function, the determining step is performed by a physical (PHY) layer of a network, and the decoding step is performed by a MAC (Medium Access Control) layer of a network.

Also, the present disclosure may provide a method of communicating data in a wireless communication system, the method comprising: receiving at least one data from an upper layer; selecting a preamble based on the at least one received data; transmitting the selected preamble; receiving a response message in response to the selected preamble, wherein the response message includes an allocated radio resource for transmitting next scheduled data; and transmitting the next scheduled data by using a configuration related to the selected preamble, wherein the preamble is an RACH (Random Access Channel) preamble, the configuration is used to generate a MAC PDU, and the MAC PDU is generated with or without a header.

Although the present disclosure is described in the context of mobile communications, the present disclosure may also be used in any wireless communication systems using mobile devices, such as PDAs and laptop computers equipped with wireless communication capabilities (i.e. interface). Moreover, the use of certain terms to describe the present disclosure is not intended to limit the scope of the present disclosure to a certain type of wireless communication system. The present disclosure is also applicable to other wireless communication systems using different air interfaces and/or physical layers, for example, TDMA, CDMA, FDMA, WCDMA, OFDM, EV-DO, Wi-Max, Wi-Bro, etc.

The exemplary embodiments may be implemented as a method, apparatus or article of manufacture using standard programming and/or engineering techniques to produce software, firmware, hardware, or any combination thereof. The term "article of manufacture" as used herein refers to code or logic implemented in hardware logic (e.g., an integrated circuit chip, Field Programmable Gate Array (FPGA), Application Specific Integrated Circuit (ASIC), etc.) or a computer readable medium (e.g., magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium may be accessed and executed by a processor. The code in which exemplary embodiments are implemented may further be accessible through a transmission media or from a file server over a network. In such cases, the article of manufacture in which the code is implemented may comprise a transmission media, such as a network transmission line, wireless transmission media, signals propagating through space, radio waves, infrared signals, etc. Of course, those skilled in the art will recognize that many modifications may be made to this configuration without departing from the scope of the present disclosure, and that the article of manufacture may comprise any information bearing medium known in the art.

As the present disclosure may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

The invention claimed is:

1. A method of communicating data in a wireless communication system, the method comprising:
receiving at least one data from an upper layer;
determining whether or not the at least one data is received through a common control channel (CCCH);
selecting a specific preamble included in a specific preamble group if it is determined that the at least one data is received through the CCCH;
transmitting the selected preamble to a network;
receiving a response message in response to the transmission of the selected preamble,
wherein the response message includes an allocated radio resource for transmitting next scheduled data; and
transmitting the next scheduled data using the allocated radio resource,
wherein the next scheduled data is transmitted by applying different cyclic redundancy checks (CRCs) according to types of data included in the next scheduled data such that an overhead of a medium access control protocol data unit (MAC PDU) included in the next scheduled data is minimized.

2. The method of claim 1, wherein the upper layer is a MAC (Medium Access Control) layer or a RLC (Radio Link Control) layer.

3. The method of claim 1, wherein the at least one data is a MAC PDU (Medium Access Control Protocol Data Unit) or an RLC PDU (Radio Link Control Protocol Data Unit).

4. A device configured to communicate data in a wireless communication system, comprising:
a processor configured to
receive at least one data from an upper layer,
determine whether or not the at least one data is received through a common control channel (CCCH),
select a specific preamble included in a specific preamble group if it is determined that the at least one data is received through the CCCH,
transmit the selected preamble to a network,
receive a response message in response to the transmission of the selected preamble,
wherein the response message includes an allocated radio resource for transmitting next scheduled data, and
transmit the next scheduled data using the allocated radio resource, wherein the next scheduled data is transmitted by applying different cyclic redundancy checks (CRCs) according to types of data included in the next scheduled data such that an overhead of a medium access control protocol data unit (MAC PDU) included in the next scheduled data is minimized.

* * * * *